United States Patent [19]
Sanders et al.

[11] Patent Number: 6,091,356
[45] Date of Patent: Jul. 18, 2000

[54] CHIRP SOURCE WITH ROLLING FREQUENCY LOCK FOR GENERATING LINEAR FREQUENCY CHIRPS

[75] Inventors: Michael Lee Sanders; John Hunt Ashton, both of Livermore, Calif.

[73] Assignee: Sensor Concepts Incorporated

[21] Appl. No.: 09/167,130

[22] Filed: Oct. 5, 1998

[51] Int. Cl.[7] .............................. G01S 7/282; H03B 23/00
[52] U.S. Cl. .......................... 342/132; 342/128; 342/175; 342/195; 342/200; 342/201; 342/89; 342/98; 342/99; 342/100; 331/1 R; 331/16; 331/17; 331/107 R; 331/177 R
[58] Field of Search ..................................... 342/128, 132, 342/134, 175, 195, 200, 201, 202, 203, 204, 89, 98, 99, 100; 331/107 R, 177 R, 178, 179, 180, 181, 187, 1 R, 16, 17

[56] References Cited

U.S. PATENT DOCUMENTS 5,376,938  12/1994  Martinez et al. ....................... 342/128

OTHER PUBLICATIONS

*Applied Microwave & Wireless*, "Microwave Synthesizer Offers 500µs Switching", Aug. 1998, p. 76.

Primary Examiner—Bernarr E. Gregory
Attorney, Agent, or Firm—Ronald C. Fish; Falk & Fish

[57] ABSTRACT

A source for a linear homodyne transceiver that generates repeated linear chirps. A YIG oscillator with a main coil and an FM coil receives a basic linear current ramp at the main coil to generate a chirp. The FM coil is coupled to receive a PLL error signal. The PLL receives a sample of the output signal from the YIG oscillator at one input and a linear chirp reference signal at the other input generated by a DDS chirp generator. Any variation between the linear chirp frequency at any instant and the actual frequency output by the YIG is corrected by an error signal to the FM coil to correct for nonlinearities of the YIG caused by variations in the chirp rate, the rate of change of frequency per second per chirp, temperature variations and microphonics.

10 Claims, 7 Drawing Sheets

ANALOG RAMP GENERATOR

DDS CLOCK SOURCE

PLL/FM COIL DRIVER

DDS SYNCHRONIZATION

CHIRP SOURCE WITH ROLLING FREQUENCY LOCK FOR GENERATING LINEAR FREQUENCY CHIRPS

FIELD OF USE

The invention has utility in the field of linear homodyne microwave transmitters for locking the frequency of the transmitted signal generated by a non linear YIG oscillator to a ideal linear ramp to insure generation of a plurality of linear chirps, each with a fixed rate of change of frequency per second regardless of microphonic disturbances or temperature variations and regardless of changes in rate of chirps per second.

Linear homodyne microwave radar transmitters are well known. One such design is illustrated in U.S. Pat. No. 5,376,938, the contents of which are hereby incorporated by reference. That patent teaches a way of linearizing the chirps generated by a nonlinear YIG oscillator. The '938 patent teaches measuring the nonlinearity of each individual YIG oscillator to determine the deviation in its output frequency from an ideal linear rate of change of frequency as each chirp is generated. The deviation between the actual generated frequency at each instant of a chirp and the ideal linear ramp was converted to a correction factor. This collection of correction factors was stored in a memory and as each chirp was generated, the correction factors were recalled from memory and used to generate error correction signals. These error correction signals were used to predistort the driving current that was applied to the frequency tuning coils of the YIG oscillator to cause the YIG oscillator at each instant in time along the chirp ramp to generate a frequency that is exactly the desired frequency defined by the ideal chirp ramp. When the output signal of the YIG is exactly the desired output frequency, the source is said to be in "phase lock".

Linear homodyne radars use frequency chirps to illuminate targets in order to generate radar cross section (hereafter RCS) data of data to generate images of the positions of reflectors on the target. Reflected signals from the target are mixed with a sample of the outgoing chirp frequency to generate IF signals. The frequency of the IF signal generated by each reflector depends upon the range of the reflector from the radar. This is because the chirp is constantly changing in frequency so the frequency of a reflected signal will be different by an amount equal to the round trip transit time of the signal times the rate of change in frequency per second of the chirp. Thus a one dimensional picture of the downrange position of the reflectors can be generated in this way by software algorithms that do digital signal processing of the collection of IF signals generated by each chirp. These algorithms assume that each chirp had a linear rate of change of frequency per second in using the IF frequencies to determine location of reflectors on targets. If the chirps were not actually linear, the image is distorted and blurry and its usefulness is reduced. This is why "phase lock", i.e., controlling the output frequency of the YIG to be exactly the frequency of the ideal chirp at each instant of time is important.

The problem with the type of linearization taught in U.S. Pat. No. 5,376,938 is that it was a fixed correction based upon a single sweep rate ($\Delta f$/sec), a single number of chirps per second, a single temperature and without microphonic disturbances present. The correction therefore became inaccurate and the chirps generated by the YIG source became nonlinear when the sweep rate changed or the number of chirps per second changed or the temperature changed or vibration or microphonic disturbances occurred. For example, all the circuits and the main coil of a YIG oscillator have transient responses. When the sweep rate or number of chirps per second change, these transient responses will be altered and that affects the magnetic field that is generated by the main coil in which the YIG sphere sits. When the magnetic field is altered, the resonant frequency of the YIG sphere changes, and the resulting output frequency is different. Changing temperature changes the resonant frequency of a YIG sphere sitting in a constant magnetic field. Therefore, all of those factors can and do frequently alter the frequency generated by a YIG oscillator away from the frequency it would generate using the same drive current values for its main coil and FM coil if those disturbances were not present.

Therefore, a need has arisen for YIG oscillator source for a linear homodyne transmitter that can generate linear chirps at all times regardless of changes in the sweep rate, the number of chirps per second, temperature changes or microphonic disturbances.

SUMMARY OF THE INVENTION

The genus of the invention is defined by the following characteristics for a linearized YIG oscillator continuous chirp generator—all species within the genus of the invention will include:

a voltage or current controlled oscillator with at least one frequency control input to receive a voltage or current signal that controls the frequency of oscillation and wherein the oscillator can oscillate at a frequency in the band of interest and has sufficient range of variation of the output frequency to cover a desired range of frequencies of every chirp, i.e., bandwidth;

a circuit for generating a reference chirp which rises continously without steps in frequency in a linear manner from a start frequency to a stop frequency and which is used as the model from which to generate a frequency control signal for application to said frequency control input thereby causing an output chirp from the oscillator which also is continous, smooth and linear with no step changes in frequency; and a feedback loop coupled to sample the output frequency of the oscillator and compare it to the desired linear chirp profile defined by the reference chirp and to adjust the frequency control signal in such as way as to move the output frequency of the oscillator toward the desired linear chirp profile.

For example, it would be within the genus of the invention as the inventors currently contemplate it to have a voltage controlled oscillator (VCO) as the oscillator and a digital or analog circuit for generating a frequency control signal in the form of a ramp with a linearly rising voltage and also generating a reference chirp with a linearly rising frequency. The frequency control signal would be applied to the frequency control input of the VCO through a summing amplifier. A sample of the output signal from the VCO would then be compared to the reference chirp (the sample and reference chirp would have to be processed to have approximately the same frequency such as by possibly dividing down the sample frequency) and a PLL or other feedback loop would compare the difference in frequency between the sample chirp and the reference chirp at all frequencies along the chirp ramp. An error signal would be generated and applied to the summing amplifier in the proper sense to adjust the frequency of the VCO to conform it with the linearity of the reference chirp. Such an embodiment is illustrated in FIG. 7.

The single preferred embodiment disclosed herein within the genus of the invention defines a preferred subclass which has two frequency control circuits driving the main and FM coils of a YIG oscillator. Specifically, each species in this preferred sub class will have the following shared characteristics:

a YIG oscillator having a main coil and an FM coil;
a circuit for creating a main coil current drive signal for each chirp consisting of a current ramp having a rising current value which is smooth, linear and has no steps therein;
a sampling circuit to sample the output frequency of the YIG oscillator;
a DDS chirp generator to generate a very accurate reference chirp with a linearly rising frequency which is continously changing and which has steps in frequency which are so small as to be imperceptible;
a phase lock loop having an error signal output driving the FM coil of the YIG oscillator and an input coupled to receive the sample and an input to receive the reference chirp for comparing the actual frequency of the sample to the reference chirp and generating an error signal of the proper sense to correct the frequency of oscillation of the YIG oscillator in a direction to conform it to the reference chirp.

In an alternative embodiment, a YIG oscillator with only a main coil could be used and a circuit to generate a current ramp having a linearly rising current value could be used to create the basic chirp with the main coil drive current being applied thereto through a summing amplifier. The other input of the summing amplifier would be supplied by the phase lock loop. The PLL would receive a reference chirp signal from a DDS or other chirp generator and a sample of the frequency output by the YIG oscillator would be applied to the wild signal input of the PLL. The PLL would compare the frequency of the sample to the desired linearly rising frequency of the reference chirp and generate an error signal to correct any deviation. This error signal would be applied to the summing amplifier to adjust the drive current to the YIG to change its frequency slightly to conform it to the desired linear chirp profile. Such an embodiment is illustrated in FIG. 7. This class of embodiments, with a YIG oscillator, would suffer more high frequency noise on the wild signal sample to the PLL, but if the loop bandwidth of the PLL is adequate, this high frequency noise can be corrected out of the output signal. In some applications, some amount of high frequency noise on the output signal might be acceptable.

In another alternative embodiment using a YIG oscillator and symbolized by FIG. 7, only an FM coil would be used to control the frequency of the YIG. This embodiment is useful when high frequency noise is undesirable in the output frequency, but the bandwidth of the chirp is not so large as to exceed the ability of the FM coil to control the frequency of the YIG oscillator. In this embodiment, the summing amplifier output is coupled to FM coil input instead of the main coil input, and all the other circuitry is the same.

In the preferred embodiment, a DDS chirp generator driving a DAC is used to generate the chirp reference signal. This embodiment is simple and only uses two chips and is highly accurate, not sensitive to temperature variations and fast. In alternative embodiments for use in applications where these properties are not important, analog circuitry to generate the chirp reference signal can be used. Further, any other form of error detection and correction circuitry can be used to monitor the output frequency and compare it to the chirp reference signal frequency and generate an appropriate polarity error signal. The only requirement is that whatever feedback loop is used to detect frequency errors and generate an appropriate error signal response be fast enough, i.e., have sufficient loop bandwidth to see and correct the highest frequency expected noise which has to be eliminated for the application. If high frequency noise can be tolerated in the application or high frequency noise above a certain upper limit is not critical, then this requirement can be relaxed and the feedback loop need only be designed to eliminate whatever degree of noise is unacceptable.

In the preferred embodiment, the PLL error signal is coupled to the FM coil and the FM coil has the capability of making frequency corrections of up to 100 MHz. This number is not critical, and the only requirement is that the loop bandwidth and FM coil frequency correction capability be adequate to remove adverse affects caused by any or all of the YIG oscillator's inherent nonlinearity with changing temperature, sweep rate or sweeps per second and microphonics.

Further, in the preferred embodiment, the loop bandwidth of the PLL is set to match the intersection of the phase noise characteristics of the PLL loop itself and the phase noise characteristics of the YIG oscillator. In the preferred embodiment, that is 40 KHz. YIG oscillators have decreasing phase noise at frequencies further and further from the carrier frequency. The general rule of thumb in designing PLLs is to set the loop bandwidth of the PLL to match the intersection between the YIG phase noise characteristics and the PLL such that the PLL does not even see noise out in the frequency regions where the phase noise of the YIG is less than that of the PLL itself so as to not make the phase noise worse in these regions. That is done in the preferred embodiment.

However, in alternative embodiments, the loop bandwidth of the PLL can be selected to be less than this intersection point so long as it is large enough to eliminate all noise that would significantly detract from or interfere with accomplishing the desired task. The inventors believe that the loop bandwidth could be set to be substantially less than the intersection described above with no severe adverse consequences and that would be within the genus of the invention.

Further, in the preferred embodiment, the main coil drive circuitry to generate the linear current ramp is analog, but it could also be digital.

DETAILED DESCRIPTION OF THE PREFERRED AND ALTERNATIVE EMBODIMENTS

Figure 1:
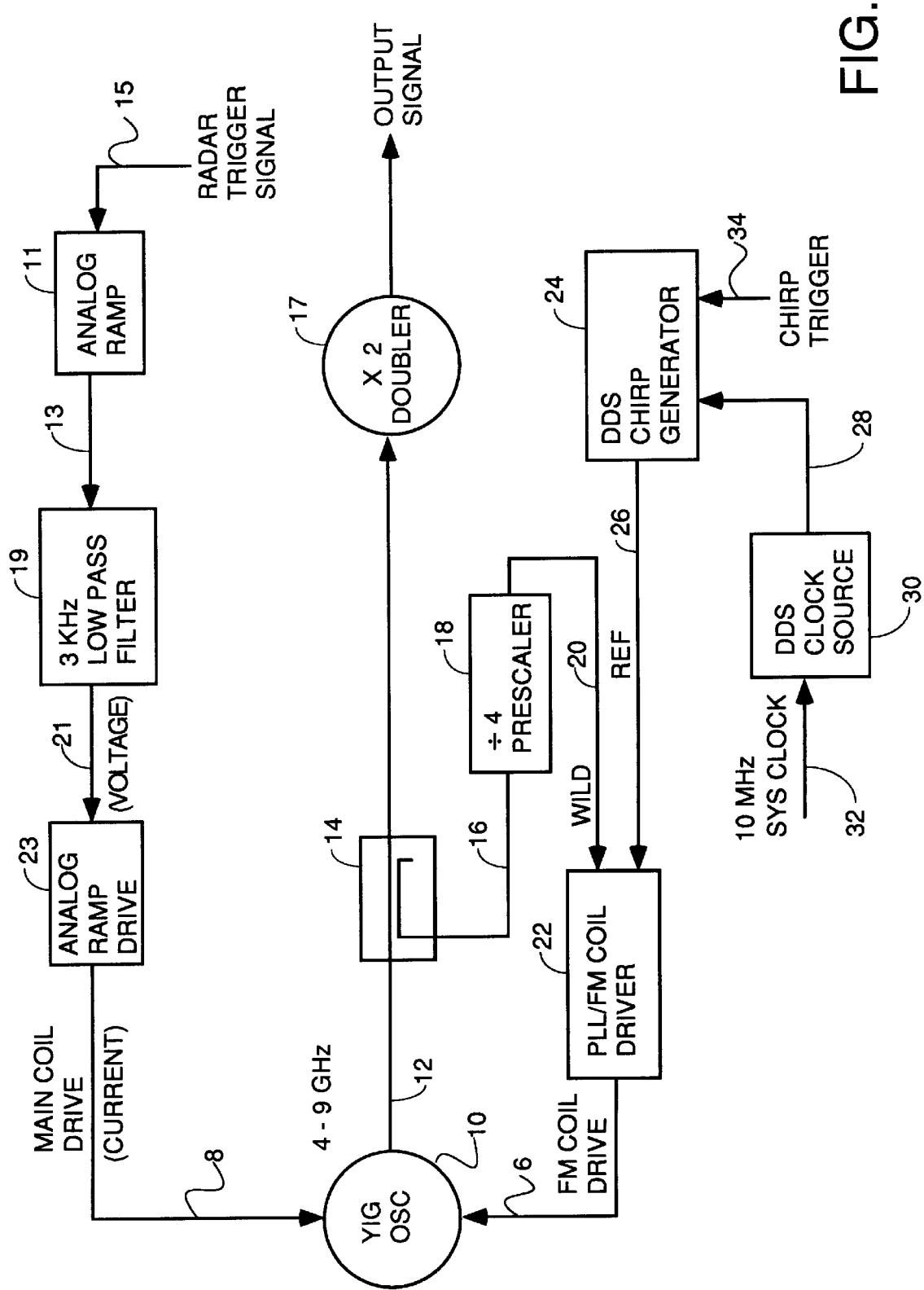
FIG. 1 is a block diagram of the preferred subclass of highly linear, rolling phase locked sources for linear homodyne microwave transceiver.

Referring to FIG. 1, there is shown the preferred embodiment of a rolling phase locked source for a linear homodyne microwave transceiver. The source comprises a YIG oscillator 10 which outputs a frequency which ramps from 4 to 9 GHz on line 12. The function of the YIG oscillator is to generate a microwave output signal on line 12 which has a controllable frequency. The YIG oscillator has a main coil control signal input 8 and a frequency modulation coil (hereafter FM coil) input 6. The current drive signal at input 8 drives a main coil inside the YIG oscillator to establish a magnetic field that establishes the resonance frequency of oscillator. The current drive signal on line 6 causes the FM coil to make adjustments in the magnetic field affecting the resonance frequency of the YIG oscillator to make small adjustments in the output frequency of the YIG oscillator. The output signal on line 12 has its frequency doubled by a factor of two by doubler circuit 17 to get the output frequency into the desired band. The doubler can be eliminated if the desired band is 4 to 9 GHz or it can multiply the frequency by some other factor if another band is desired.

The function of the rest of the circuitry is to control the input drive signal to the main coil to establish the basic frequency sweep of each chirp and to control the input drive signal to the FM coil to correct the output frequency on line 12 to conform to an ideal linear ramp of increasing frequency during each chirp so as to achieve "rolling frequency lock" also sometimes referred to as "rolling phase lock".

The basic frequency of the YIG oscillator is established by the circuitry coupled to the main coil input. This circuitry comprises an analog ramp generator 11 which generates an approximately linear ramp voltage on line 13 upon each activation of a Radar Trigger signal on line 15. The Radar Trigger signal is synchronized to activate only on a rising clock edge of an edge of a system clock signal on line 32 to reduce jitter in the system.

Activation of the Radar Trigger signal causes the analog ramp circuit to generate a linearly rising voltage on line 13 to start the process of generating a chirp. In general, any type of circuit that can generate a linear ramp voltage with sufficient offset to drive the main coil to establish the desired start frequency and enough range such that at the end of the ramp, the output frequency of the YIG oscillator is at the desired stop frequency or higher will suffice to practice the invention. In the preferred embodiment, the analog ramp generator circuit 11 will have controls that allow the ramp rate to be changed as well as the start and stop voltages and the offset from zero and will be fabricated with low noise components.

A low pass filter 19, preferably with an upper 3 dB rolloff at 3 KHz functions to remove high frequency noise from the ramp signal on line 13. The filtered ramp voltage output of the low pass filter on line 21 is converted to a current ramp signal on line 8 by an analog ramp drive circuit 23. In embodiments where the loop bandwidth of the PLL is sufficiently large to eliminate high frequency noise that the low pass filter 19 filters out or where this high frequency noise in the output on line 12 can be tolerated, low pass filter 19 can be eliminated.

Preferably, the analog ramp driver circuit 23 is a low noise circuit made by selecting low noise components for its construction but this is not an absolute requirement and any voltage to current converter will suffice. This is preferred because noise on the main coil drive signal on line 8 translates to frequency fluctuations on the output signal on line 12. Use of a analog ramp driver 23 which is not low noise gives the PLL 22 more work to do in stabilizing the frequency on line 12, but if it has sufficient loop bandwidth to eliminate the resulting noise or the noise can be tolerated, the low noise analog ramp driver 23 can be any voltage-to-current converter.

Although all of circuits 11, 19 and 23 have been specified as analog circuits, digital circuitry to perform the same functions could be substituted.

A unidirectional coupler 14 samples the output signal from the YIG oscillator and outputs the sample signal on line 16. A divide-by-4 prescaler 18 divides the frequency on line 16 by a factor of 4 and transmits the result on line 20 to the unregulated or "wild" signal input of a phase lock loop FM coil driver circuit 22. The prescaler 18 is only used because the output from the YIG oscillator ranges from 4 to 9 GHz, but the particular phase lock loop chip from National Semiconductor used for PLL/FM coil driver 22 only works for unregulated signals at input 20 up to 2.5 GHz. If another phase lock loop with a higher allowable frequency input were to be used, the prescaler could be eliminated. The particular PLL chip selected for circuit 22 is an integrated circuit chip used widely in wireless applications and is plentiful and inexpensive. More exotic PLL circuits can be substituted as can other types of feedback loops capable of comparing the sample frequency to the reference chirp and generating an error signal which corrects the YIG oscillator frequency.

A DDS chirp generator 24 supplies a reference chirp signal on line 26 to the reference frequency input of the phase lock loop which has a frequency which is ramped linearly upward to define a chirp. The DDS chirp generator receives a 108 MHz reference clock signal on line 28 which is generated by a DDS clock source 30 to be phase coherent with a 10 MHz system clock signal on line 32.

The reference clock signal on line 28 is generated by the DDS clock source to be phase coherent with the 10 MHz system clock, i.e., every clock edge of the reference clock signal on line 28 will be synchronous with a clock edge of the system clock signal on line 32 even though the reference clock signal is at a different frequency than the system clock signal. DDS chirp generators require clock signals which are many times higher than the reference frequency they generate. However, if the system clock signal on line 32 was about 100 MHz, there would be no need for the DDS clock source 30.

Both the Radar Trigger signal on line 15 and the Chirp Trigger signal on line 34 are generated so as to be synchronous with a 10 MHz system clock edge with activation of the Chirp Trigger being delayed slightly from activation of the Radar Trigger. The degree of delay is not important so long as the degree of coordination is such that PLL 22 does not lose lock. Maintaining constant lock is important so that the chirps can change frequency rapidly without losing linearity and so that the chirp rate per second can be high without losing linearity.

The DDS chirp generator is started on its upward ramp by a Chirp Trigger signal on line 34. Like the Radar Trigger signal on line 15, the Chirp Trigger signal causes the DDS chirp generator to start generating the reference signal on line 26. The frequency of the reference signal on line 26 is increased linearly throughout the chirp. In the preferred embodiment, the DDS chirp generator is a Qual Comm 2368. In alternative embodiments, any circuitry that can generate a chirp reference signal with linearly increasing frequency will suffice for practicing the invention.

The reference signal on line 26 is a sign wave which is digitally generated by a digital-to-analog converter in a very small steps. These small steps of voltage in the sign wave function are smoothed out by a low pass filter with a 25 MHz upper rolloff inside PLL 22 and coupled to filter the reference signal on line 26. The frequency of the reference signal is also changed in stepwise fashion to implement the linearly ramped chirp reference waveform, but the step are only 300 Hz, so they are virtually imperceptible in the output frequency if they are perceptible at all. The step size in frequency change of the reference signal must be small enough such that the PLL 22 never loses lock and has to reacquire. In other words, the changes in frequency must be in small enough steps and frequent enough to allow the PLL to maintain continuous lock.

The DDS chirp generator has a noise reduction feature which is enabled so as to give 60–70 dB dynamic range of the magnitude of the desired frequency component on line 26 versus any other spurious noise components on the line. In the preferred embodiment, the DDS chirp generator 24 is adjusted to generate a ramp signal on line 26 which linearly ramps up in frequency at a rate needed to establish the desired rate of change in frequency of the chirp, typically 5000 GHz per second. Once this rate of change is established for the reference signal on line 26, the offset on the analog ramp signal on line 13 is adjusted until the error signal indicates that phase lock has occurred at the start frequency of the chirp. This process is done before a system is shipped to get the system adjusted so that the analog ramp signal on line 13 and the ramped reference signal on line 26 are coordinated and synchronized so that the deviations between the actual output frequency and the desired output frequency do not become so large that PLL cannot successfully track the reference frequency on line 26. In alternative embodiments, any other circuitry such as analog circuitry can be used to generate the chirp reference signal on line 26.

The PLL/FM coil driver circuit compares the frequency of the wild signal on line 20 which is a sample of the output frequency to the linearly increasing reference signal on line 26 and generates an error signal on line 6 which is used to drive the FM coil to move the frequency of the YIG oscillator 10 toward the reference signal. This process continues iteratively until the YIG oscillator output frequency exactly conforms in frequency to the reference frequency generated by the DDS chirp generator 24. Because the DDS chirp generator generates an exactly linear ramp, the YIG oscillator is forced to generate an exactly linear ramp in frequency for each chirp, and a rolling phase or frequency lock has been achieved.

More precisely, the wild signal on line 20 gets divided down to a phase detector frequency of 5 MHz inside the PLL circuit 22 as does the reference signal on line 26. One alternative embodiment would be to make the reference signal fixed in frequency and very stable and linearly change the divide down ration used inside the PLL 22 to establish a linear ramp phase detector signal inside the PLL from the fixed frequency reference. In the preferred embodiment, the divide down ratio stays fixed, and the DDS chirp generator 24 linearly ramps the reference signal on line 26 from 10 to 18 MHz starting at time just long after the Radar Trigger signal on line 15 goes active and the initial transient interval of the analog ramp signal has passed. Typically a fixed delay of 100 microseconds is used to activate the Chirp Trigger signal after activation of the Radar Trigger signal. As the reference signal generated by the DDS chirp generator rises in frequency, the wild signal frequency on line 20 deviates from the reference signal, and an error signal on line 6 is generated which causes correction to the YIG output frequency to a linearly rising chirp from 4 to 9 GHz. The phase lock loop and DDS chirp generator therefore combine to correct for any nonlinearity in the YIG oscillator response to the linear ramp signal driving the main coil and correct for any temperature variations or microphonic disturbances or changes in rate of change of frequency per second or any changes in the number of chirps per second. The result is a linear chirp every time regardless of changes in any or all of the above cited factors that can cause loss of phase lock.

Further, because phase lock acquisition is achieved in the invention initially and thereafter the reference frequency rises in a continuous linear fashion at a rate such that the PLL can continuously track it and maintain lock, there is no delay in reacquiring phase lock. In prior art source for linear homodyne radars, the PLL had to reacquire lock before each new chirp. That took 20–30 milliseconds, so generation of multiple chirps sweeping throughout the 4–9 GHz range (the range or bandwidth defines the depth or downrange length of a target the transceiver can generate an RCS image of) takes longer than is the case of a linear homodyne radar using the invention. This made it difficult in prior art linear homodyne transceivers to do many chirps per second.

There is a slight delay between activation of the Radar Trigger signal (activated first) and activation of the Chirp Trigger signal. The reason for this delay is to start the DDS chirp reference signal at a time after the transient startup effects of the analog ramp circuit 11 and the low pass filter 19 have died down. That is, when the Radar Trigger signal activates, the analog ramp circuit and the low pass filter cannot respond instantaneously to start generating a linearly rising voltage right away. Parasitic and other capacitances have to be charged up and parasitic inductances have to have their inertial states overcome. This takes a short time. When the analog ramp and low pass filter have passed out of their transient response regions and reached steady state operation of generating a linearly rising voltage on line 13, the Chirp Trigger signal 34 is activated.

The DDS chirp generator 24 and the PLL 22 combine to correct the output frequency on line 12 to conform to the precisely linear chirp ramp established as a reference by the DDS chirp generator 24.

Figure 2:
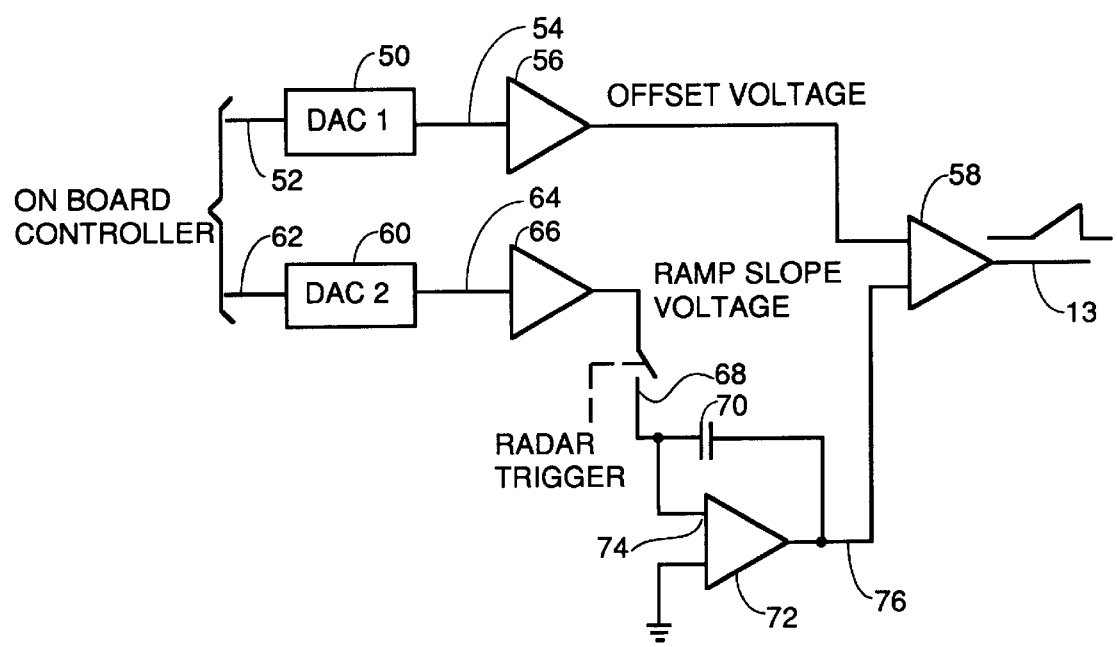
FIG. 2 a block diagram of the main functional components of the analog ramp generation circuit 11.

Referring to FIG. 2, there is shown a block diagram of the main functional components of the analog ramp generation circuit 11. A first digital-to-analog converter (hereafter DAC) 50 receives an offset voltage control word on bus 52 from an on-board controller which does not form part of the invention. DAC 50 responds by generating an offset voltage on line 54, usually somewhere in the range from 0–12 volts. An amplifier 56 buffers the offset voltage and applies it to one input of a differential amplifier 58 which drives output line 13 with the desired ramp voltage. Another DAC 60 receives a ramp rate control word on bus 62 which causes DAC 60 to generate a ramp rate control voltage on line 64, usually between 0 and 12 volts. An amplifier 66 buffers this voltage and applies it via line 68 to an input node of an integrator comprised of a feedback capacitor 70 and operational amplifier 72. The higher the ramp slope voltage on line 68, the faster is the rate of change of the generated ramp voltage on line 13. The voltage on line 68 is applied to a virtual ground at input 74 and causes a current which gets integrated in capacitor 70 which causes a linear rise in voltage at output 76. This voltage is applied to the other input of differential amplifier 58.

Figure 3:
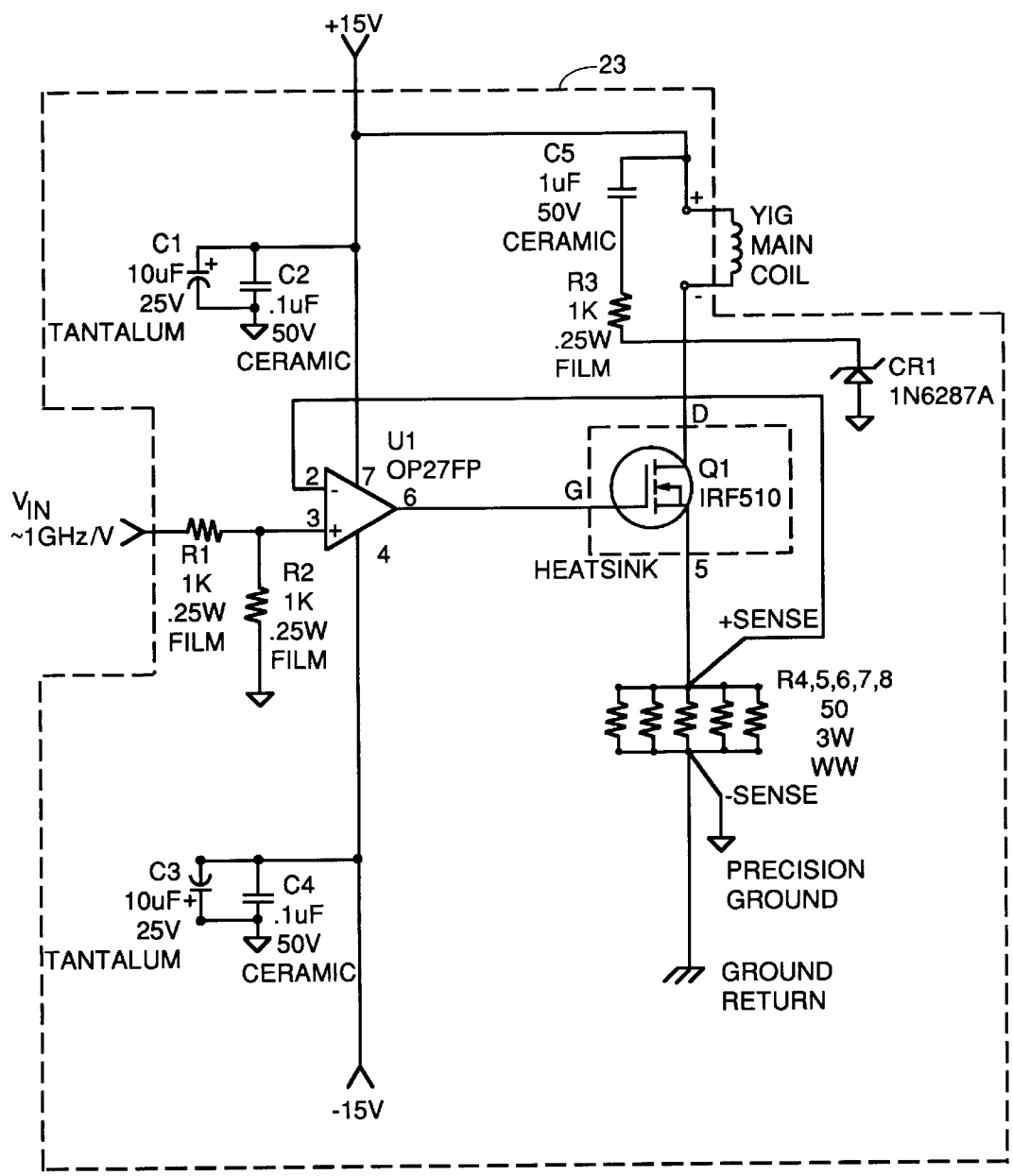
FIG. 3 is a schematic diagram of a voltage-to-current converter used for the preferred low noise main coil driver.

Referring to FIG. 3, there is shown a detailed schematic diagram of the voltage-to-current conversion circuitry of the analog ramp driver 23.

Figure 4:
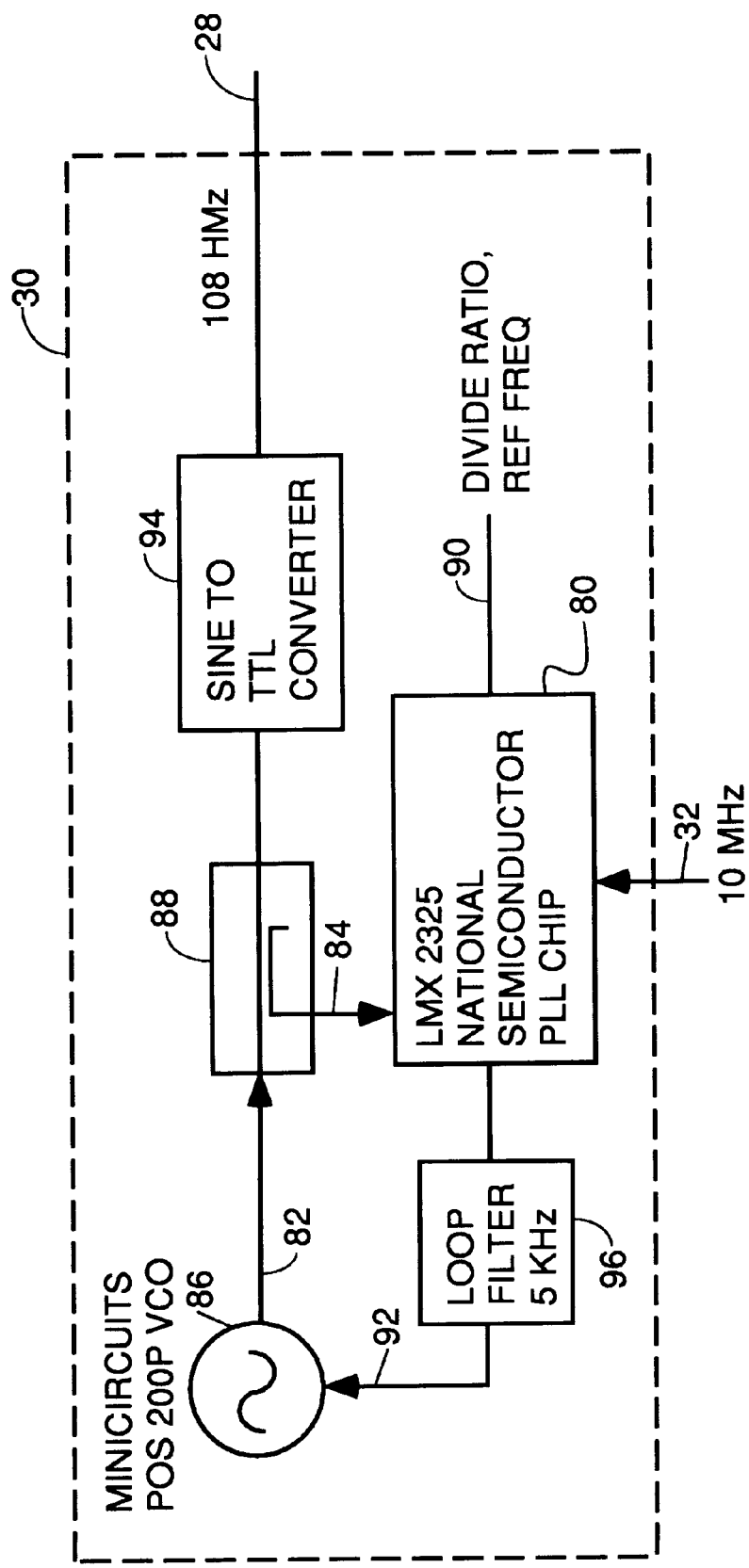
FIG. 4 is a block diagram of the DDS clock source.

Referring to FIG. 4, there is shown a block diagram of the DDS clock source 30 in FIG. 1. The function of this circuit is to generate a 108 MHz clock reference signal on line 28 which is phase coherent with the 10 MHz system clock on line 32. The circuit is comprised of PLL chip which receives the 10 MHz system clock on line 32 and a sample on line 84 of the output frequency on line 82 generated by a voltage controlled oscillator 86. The sample signal is the wild signal input to the PLL and is tapped off by a unidirectional coupler 88. The PLL receives a control word on bus 90 from the on board controller which sets the divide ratio and the desired reference frequency to be generated on line 28. The VCO generates an output frequency on line 82 and receives an error signal input on line 92 from the PLL chip via a low pass loop filter 96 with a 5 KHz upper cutoff sets the loop bandwidth at a value which can cancel any troublesome high frequency noise on the system clock. The error signal forces the VCO to output an 108 MHz signal on line 82 which is phase coherent with the 10 MHz system clock signal. A sine to TTL level converter 94 clips the sine wave output signal on line 82 to TTL logic levels to define a 108 MHz clock square wave reference signal on line 28 used by the DDS chirp generator 24.

In the preferred embodiment, the PLL chip 80 is a National Semiconductor LMX 2325, and the VCO is a Minicircuits P0S 200P.

Figure 5:
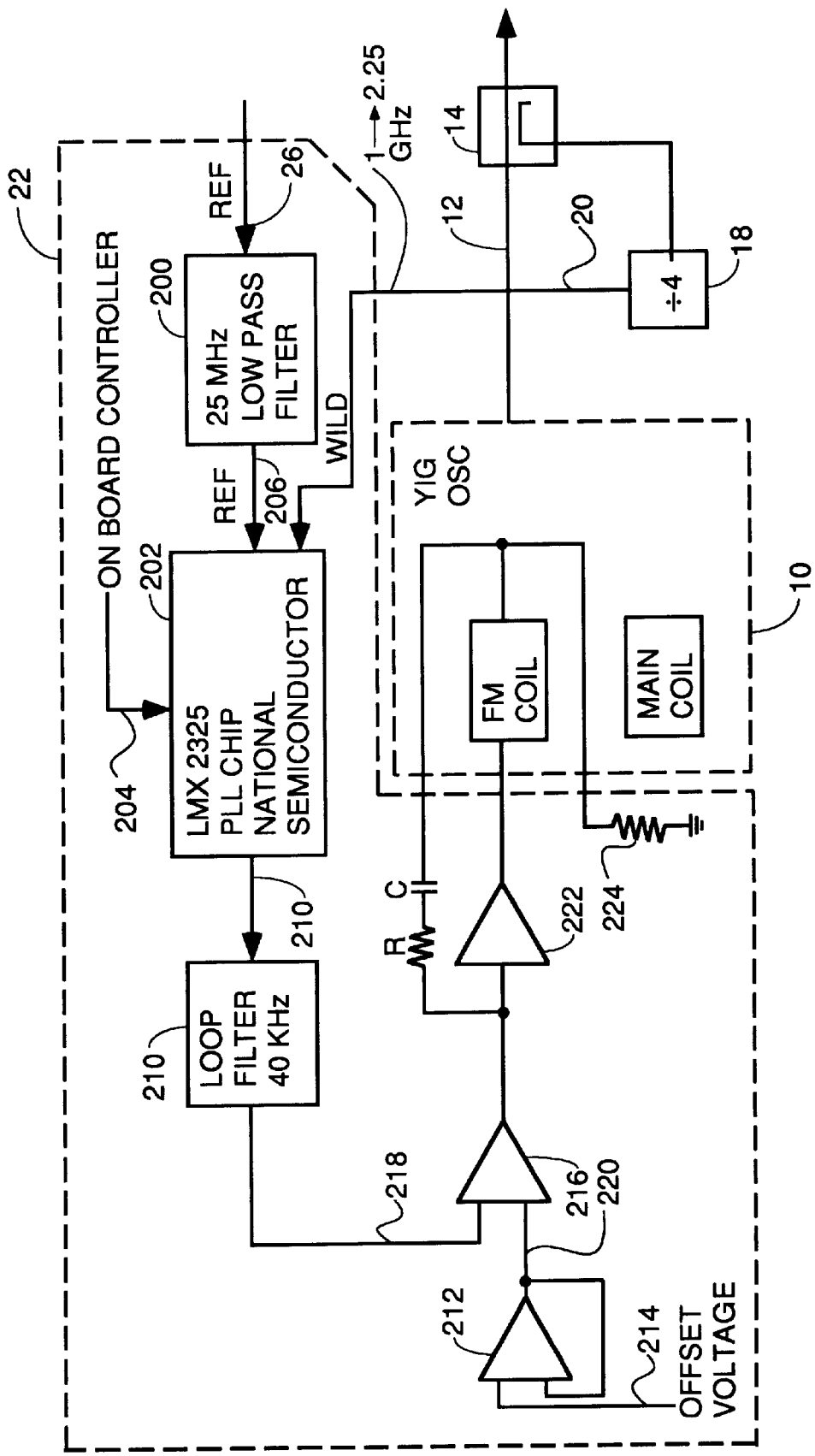
FIG. 5 is a block diagram of the preferred PLL/FM coil driver circuit.

Referring to FIG. 5, there is shown a block diagram of a PLL/FM coil driver circuit 22. The reference chirp on line 26 from the DDS chirp generator is filtered by a low pass filter 200 with 25 MHz cutoff which functions to smooth out the reference signal chirp signal and eliminate high frequency noise therefrom. PLL chip 202 receives setup words from the on-board controller via bus 204 once upon initialization to setup divide ratios etc. to divide down the sample frequency and the reference chirp to a common internal frequency. The PLL receives the reference chirp on line 206 and the sample signal on line 20 (typically 1 to 2.25 GHZ), compares their frequencies and generates an error signal on line 210. The error signal is filtered by a low pass filter 210 having a 40 KHz cutoff so as to set the loop bandwidth at 40 KHz, a value which substantially matches the intersection between the PLL loop phase noise characteristics and the YIG oscillator phase noise characteristics. A smaller value for this loop bandwidth will suffice as discussed in the summary of the invention.

The error signal output by the PLL chip ranges from 0.5 to 4.5 volts single ended. However, the FM coil can function with error signals that range on both sides of zero. To take advantage of the full dynamic range of the FM coil to, operational amplifier 212 connected as an emitter follower is used with one input coupled to an offset voltage on line 214 where the offset voltage is set to be in the middle of the dynamic range of the FM coil. Operational amplifier receives the filtered error signal on line 218 at one input and the offset voltage from the output of amplifier 212 on line 220 at the other input. The offset voltage on line 220 converts the error voltage swing to a +2 to −2 volt swing. The output of op amp 216 drives a voltage-to-current converter amplifier 222. The combination of amplifiers 216 and 222 double this swing. This arrangement allows the range of frequency correction that can be done with the FM coil to be extended from the 40 MHz that would have been available with the single ended error signal alone to the existing 80–100 MHz frequency correction range of the preferred embodiment. It was discovered that the 40 MHz range was not quite sufficient to correct for all nonlinearities that can arise.

The amplifier 222 and its feedback resistor R and feedback capacitor C for a parallel tuned resonant circuit with the FM coil which can be modelled as an inductor. The resonance frequency establishes the frequency output by YIG oscillator 10 on line 12. Resistor 224 is a sense resistor which senses the amount of current being driven through the FM coil. Amplifier 222 is a low noise MOSFET amplifier in the preferred embodiment.

Figure 6:
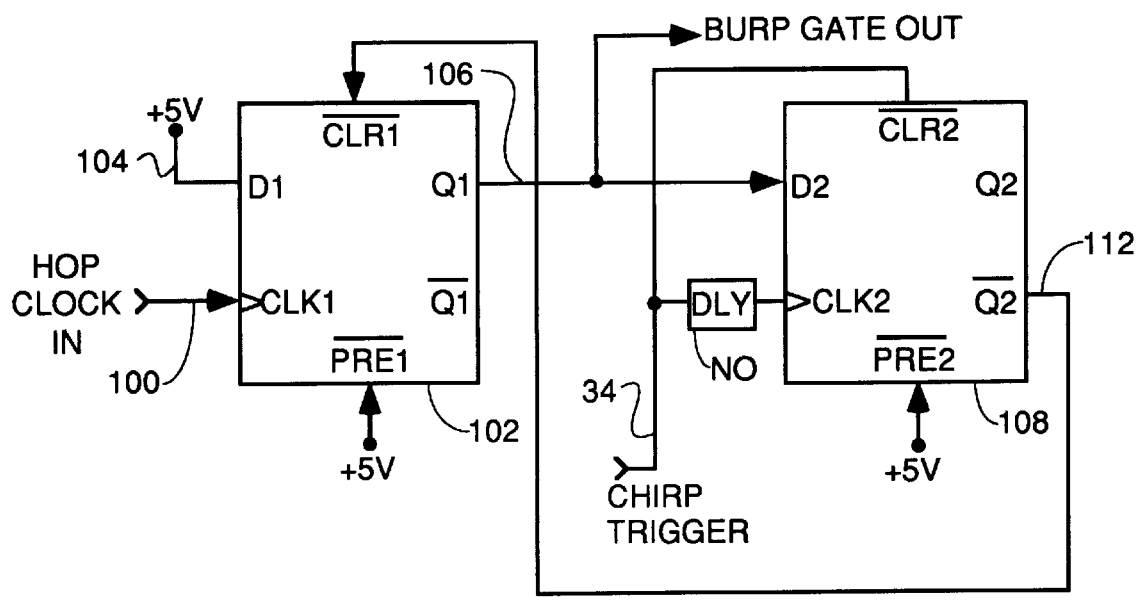
FIG. 6 is a block diagram of the preferred DDS synchronization circuit to hold the DDS from generating another chirp reference until another occurrence of another Radar Trigger signal.

Referring to FIG. 6, there is shown a block diagram of the DDS synchronization circuitry used to control the DDS chirp generator without using an expensive microcontroller. The function of this circuitry is to control the DDS to generate a chirp reference signal on line 26 and when it is done to revert to a frequency for the reference signal which is selected to keep the YIG oscillator outputting a steady output frequency which is the start frequency for the chirp. The DDS chirp generator is programmed to continuously output one chirp after another like a sawtooth waveform. At the end of each chirp (fstop frequency), the DDS chip, if not inhibited, would reset to the beginning frequency (fstart) and begin another chirp immediately. However, such a behavior would be incompatible with the operation of the rest of the circuitry in the linear homodyne system. To be compatible with the rest of the system, the next chirp cannot begin until it is triggered to do so. The circuit to synchronize the DDS chirp function with the rest of the system utilizes the two D type flip flops of FIG. 6.

The flip flops work as follows. The DDS chirp generator chip generates a Hop Clock In signal on line 100 when it has finished a chirp and has reset to the beginning frequency in preparation for the next chirp. This Hop Clock In signal is coupled to the CLK1 input of the first flip flop 102 and causes its Q1 output line 106 to go high because the D1 input is connected to +5 volts via line 104. Line 106 is coupled to the D2 input of the second flip flop 108. The signal on line 106 is called the Burp Gate Out signal and is coupled to a Burp input of the DDS chirp generator 24 in FIG. 1. When the Burp input of the DDS chirp generator is high, the DDS chirp generator freezes its output reference frequency on line 26 in FIG. 1 at its current frequency which happens to be fstart, the start frequency of the chirp. This situation remains the same as long as flip flop 102 maintains its Q1 output high.

When the rest of the linear homodyne system is ready for another chirp, it activates the Chirp Trigger signal on line 34. When the Chirp Trigger signal is activated, a fixed delay circuit 110 imposes a two gate delay of 30 nsec before clocking flip flop 108. Because the D2 input of flip flop 108 is high when it gets clocked, the Q2 output of flip flop 108 goes high and the Q2* output 112 of flip flop 108 goes low. Line 112 is coupled to the CLR1* input of flip flop 102 so when flip flop 108 gets set upon activation of Chirp Trigger, flip flop 102 gets cleared which forces the Q1 output line 106 to go low. This causes the Burp input of the DDS chirp generation circuit to go low so the DDS chirp generator starts a new chirp generation process synchronously with the Radar Trigger signal but slightly delayed therefrom. At the end of this chirp, the DDS chirp generator then generates another Hop Clock In signal on line 100 in FIG. 6, and the hold cycle occurs again until the next occurrence of the Radar Trigger signal.

Figure 7:
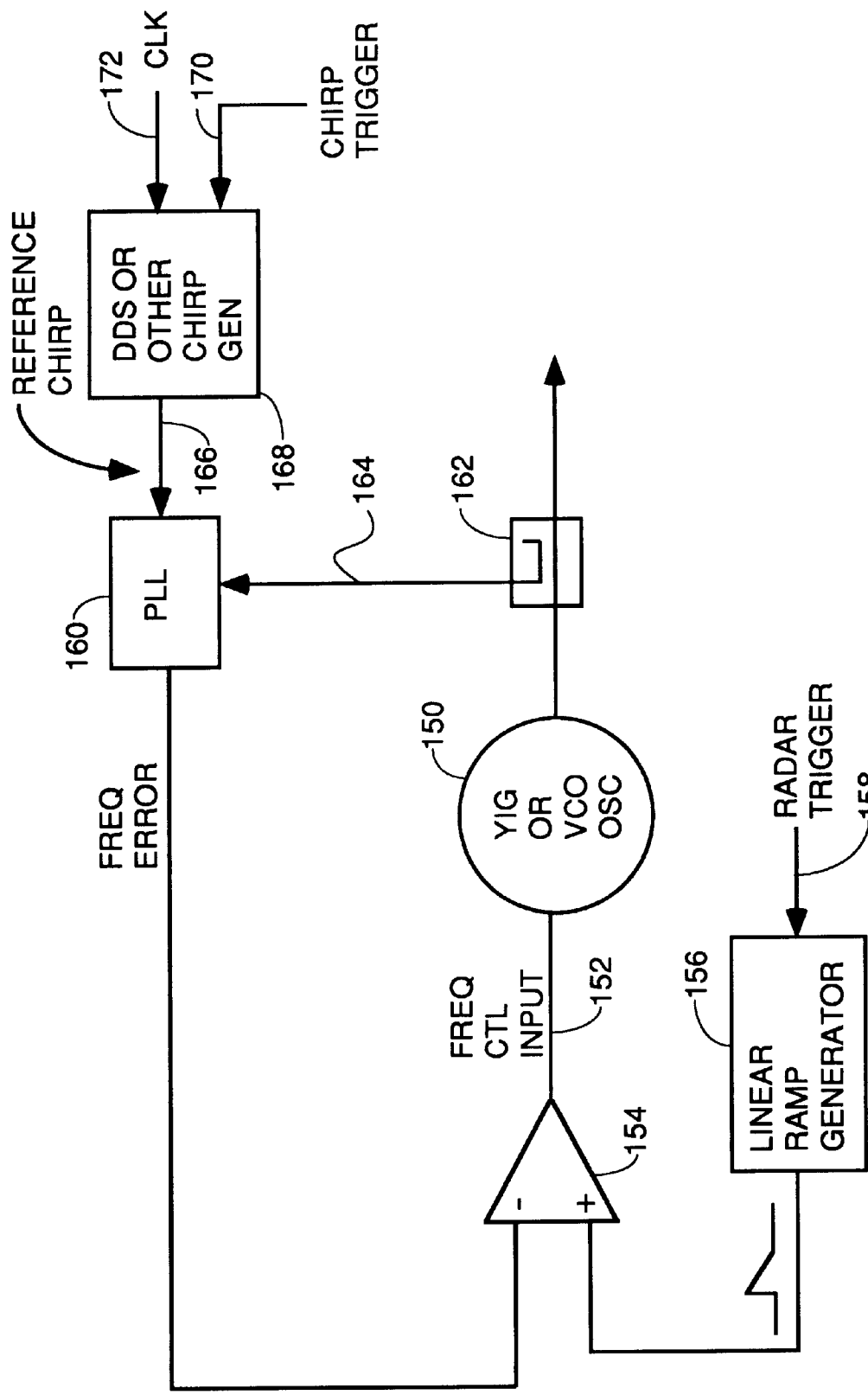
FIG. 7 is a block diagram of an alternative embodiment using either a VCO or YIG and only a single frequency control signal applied to the frequency control input of the oscillator through a summing amplifier.

Referring to FIG. 7, there is shown an alternative embodiment. In the preferred version of this alternative embodiment, a YIG oscillator 150 with only a single frequency control input 152 coupled to a main coil is used. In other species within this subclass, a VCO could be substituted for oscillator 150.

The frequency control input is driven through a summing amplifier 154 with a frequency control signal having a linearly ramping increase in current if a YIG oscillator is used or a linearly increasing voltage if a VCO is used. This frequency control signal is generated by a linear ramp generator circuit 156. This circuit generates a ramp having a linearly rising current or voltage value upon each activation of a Radar Trigger signal on line 158.

The other input of the summing amplifier 154 is coupled to receive a Frequency Error correction signal output by a phase lock loop 160. The PLL receives a reference chirp signal on line 166 from a DDS or other chirp generator 168. This reference chirp signal has a linearly rising signal and is output each time a Chirp Trigger signal on line 170 is activated. If a DDS chirp generator is used, it also receives a clock signal on line 172 which is approximately at least 3 times higher in frequency than the average frequency of the reference chirp. For the lowest phase noise operation for this class, the Chirp Trigger is generated after a slight delay of approximately 30 nsec following activation of the Radar Trigger signal, and the Radar Trigger signal is synchronized to always occur on a clock edge of the clock signal on line 172. The exact delay used in not important so long as the Chirp Trigger and Radar Trigger signals are sufficiently coordinated such that the PLL does not lose lock. If the reference chirp is not the same frequency as the sample, suitable divider circuitry in the PLL gets the sample and the reference chirp to approximately the same frequency.

This class of embodiments with no use of the FM coil and with a YIG oscillator, would suffer more high frequency noise on the wild signal sample to the PLL, but if the loop bandwidth of the PLL is adequate, this high frequency noise can be corrected out of the output signal. In some applications, some amount of high frequency noise on the output signal might be acceptable.

Although the invention has been disclosed in terms of the preferred and alternative embodiments disclosed herein, those skilled in the art will appreciate possible alternative embodiments and other modifications to the teachings disclosed herein which do not depart from the spirit and scope of the invention. All such alternative embodiments and other modifications are intended to be included within the scope of the claims appended hereto.

What is claim is:

1. An apparatus comprising:
   a system clock for generating a system clock signal;
   a YIG oscillator having a main coil the current through which controls the frequency of oscillation and having an FM coil the current through which causes small adjustments in the frequency of oscillation of said YIG oscillator, and having an output;
   first means having an input for receiving a Radar Trigger signal and coupled to said main coil for generating a repeatable linearly increasing current ramp signal which begins to rise from a predetermined starting point each time said Radar Trigger signal is activated synchronously with a clock edge of said system clock signal and resets to said starting point after each ramp is completed;
   second means for sampling the output signal from said YIG oscillator and providing the sample at a wild signal output; and
   third means coupled to said system clock signal and having an input for receiving a Chirp Trigger signal and having an input coupled to said wild signal output to receive a sample of said YIG oscillator output signal, and having an error signal output coupled to said FM coil of said YIG oscillator, for, upon activation of said Chirp Trigger signal, generating a chirp reference signal having a linearly increasing frequency and for generating an error signal at said error signal output to drive the frequency of said YIG oscillator to conform to a linearly increasing frequency chirp as a function of said chirp reference signal.

2. An apparatus comprising:
   a YIG oscillator having a variable frequency output and a main coil input and a FM coil input;
   circuitry including an analog ramp driver driving a low pass filter and a low noise voltage-to-current converter coupled to said main coil input and having an input for receiving a first trigger signal for generating a repeatable frequency control current ramp signal having a linearly increasing amplitude which begins from a predetermined starting point at each activation of said trigger signal and resets to said starting point at the completion of said ramp signal;
   a phase lock loop having an error signal output coupled to said FM coil input and having a sample signal input and a reference chirp signal input;
   a direct digital synthesis chirp generator coupled to said reference chirp signal input and having an input for receiving a chirp trigger signal and an input for receiving a reference clock signal, for generating a reference chirp signal having a linearly increasing frequency; and
   a sampling circuit having an input coupled to said output of said YIG oscillator and having an output coupled to said sample signal input of said phase lock loop.

3. The apparatus of claim 2 wherein said phase lock loop has a loop bandwidth adequate to suppress at least some troublesome noise and nonlinearities or drift that would prevent the frequency of said output signal of said YIG oscillator from rising substantially linearly with every chirp.

4. A process for generating a linear chirp comprising:
   providing to the frequency control input of an oscillator a ramp signal with linearly rising current or voltage thereby causing said oscillator to change frequency in generally linear but unregulated manner;
   sampling the output frequency of said oscillator;
   generating a reference chirp with a linearly rising frequency said reference chirp beginning its rise in frequency at the same time said ramp begins to rise;
   comparing the frequency of said reference chirp to said sample of the output frequency of said oscillator and generating an error signal of a magnitude and sign which if summed with said ramp signal would cause said oscillator to change its output frequency in a direction so as to tend to conform the output frequency of said oscillator to the output frequency of said reference chirp; and
   summing said error signal with said ramp signal so as to linearize the chirp signal generated by said oscillator.

5. A process for controlling a YIG oscillator with a main frequency control input and an FM frequency control input so as to generate a linear chirp, comprising:
   generating a current signal in the form of a linearly rising ramp which is smooth and has no steps therein and applying said current signal to said main frequency control input said ramp beginning to rise at the time of trigger signal;
   sampling the output frequency of said YIG oscillator;
   using a DDS or direct digital synthesizer to generate a very accurate reference chirp beginning at the time of said trigger signal, said reference chirp rising in frequency along a generally linear ramp comprised of steps in frequency which are small enough to not cause perterbations in the output frequency of said YIG oscillator that are too large for the particular application to which said YIG oscillator chirps are being used;

using a phase lock loop to compare the sampled frequency of said YIG oscillator to the frequency of said reference chirp and generate an error signal; and applying said error signal to said FM frequency control input of said YIG oscillator.

6. A process for controlling a YIG oscillator having a frequency control input to generate a plurality of linear chirp signals in response to a plurality of trigger signals, comprising:

generating a linearly rising current ramp signal and applying it to one input of a summing amplifier which has its output coupled to said frequency control input;

generating a reference chirp signal in a direct digital synthesizer or any other circuit that can generate a substantially perfect linearly-rising in frequency reference signal hereafter referred to as a reference chirp, said reference chirp and said current ramp signal each being initiated each time a trigger signal occurs;

comparing a sample of the output frequency of said YIG oscillator or a lower derivative frequency of said output frequency of said YIG oscillator to the frequency of said reference chirp and generating an error signal; and applying said error signal to another input of said summing amplifier.

7. The process of claim 6 further comprising the step of removing high frequency noise in the output signal of said YIG oscillator by generating said error signal using a phase lock loop with a sufficiently high loop bandwidth to remove said high frequency noise.

8. A process for controlling a YIG oscillator having a main frequency control input and an FM input to generate a plurality of very linear chirp signals in response to a plurality of trigger signals, comprising:

receiving each trigger signal, and responding to each by generating an approximately linearly rising ramp voltage;

removing high frequency noise from said linearly rising ramp voltage by passing it through a low pass filter;

converting said filtered ramp voltage signal to a current ramp signal and applying said current ramp signal to said main frequency control input of said YIG oscillator to generate an unregulated chirp signal;

sampling the output frequency of said YIG oscillator and dividing the frequency sample down to a frequency suitable for a phase lock loop, and applying the lower derivative frequency sample to an unregulated signal input of phase lock loop;

using a direct digital synthesizer to generate a reference chirp signal in response to a chirp trigger signal which is phase coherent with said trigger signal but slightly delayed from said trigger signal but slightly delayed from said trigger signal, both said trigger signal and said chirp trigger signal being phase coherent with a system clock signal and driving said direct digital synthesizer with a reference clock signal which is phase coherent with said system clock signal;

applying said reference chirp signal to a reference input of said phase lock loop, and applying the error signal output by said phase lock loop to said FM input of said YIG oscillator.

9. The process of claim 8 wherein said direct digital synthesizer changes frequency in generating said reference chirp signal in steps which are small enough that said phase lock loop never loses lock.

10. The process of claim 8 wherein said DDS is configured to achieve a desired rate of change of frequency for said reference chirp and then an offset voltage from zero for said start voltage of said ramp voltage is adjusted until said phase lock loop achieves phase lock.

* * * * *